(12) United States Patent
Song

(10) Patent No.: US 6,891,447 B2
(45) Date of Patent: May 10, 2005

(54) ELECTROMAGNETIC COUPLING CONNECTOR FOR THREE-DIMENSIONAL ELECTRONIC CIRCUITS

(75) Inventor: William S. Song, Lexington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 20 days.

(21) Appl. No.: 10/459,667

(22) Filed: Jun. 11, 2003

(65) Prior Publication Data

US 2004/0095201 A1 May 20, 2004

Related U.S. Application Data

(60) Provisional application No. 60/395,456, filed on Jul. 12, 2002.

(51) Int. Cl.[7] .............................. H01P 1/04; H05K 1/14
(52) U.S. Cl. ........................ 333/24 R; 333/27; 361/803
(58) Field of Search ................................. 333/24 R, 27, 333/260; 257/686, 777; 361/790, 803

(56) References Cited

U.S. PATENT DOCUMENTS

| | | |
|---|---|---|
| 3,742,408 A | 6/1973 | Jaeger |
| 4,038,625 A | 7/1977 | Tompkins et al. |
| 4,884,982 A | 12/1989 | Fleming et al. |
| 5,119,172 A | 6/1992 | Cho et al. |
| 5,212,115 A | 5/1993 | Cho et al. |
| 5,432,486 A | 7/1995 | Wong |
| 5,557,068 A | 9/1996 | Chung |
| 5,786,979 A | 7/1998 | Douglass |
| 5,818,748 A | 10/1998 | Bertin et al. |
| 5,821,625 A | 10/1998 | Yoshida et al. |
| 5,995,379 A | * 11/1999 | Kyougoku et al. ......... 361/803 |
| 6,033,263 A | 3/2000 | Weidler et al. |
| 6,559,531 B1 | 5/2003 | Sutherland |
| 6,717,251 B2 | 4/2004 | Matsuo et al. |

FOREIGN PATENT DOCUMENTS

GB 2 149 548 A 6/1985

OTHER PUBLICATIONS

Kuijk et al., Integration of CMOS–VLSI and . . . , Electronics Letters, Oct. 9, 1997, p. 1778–9, vol. 33 No. 21.
Berard et al., Capacitive Coupled Connector, IBM Technical Disclosure Bulletin, Jul. 1975, p. 355–6.
Krembs, Capacitive–coupled Connectors for Gaseuous . . . , IBM Technical Disclosure Bulletin, Apr. 1971.

* cited by examiner

*Primary Examiner*—Robert Pascal
*Assistant Examiner*—Dean Takaoka
(74) *Attorney, Agent, or Firm*—Guerin & Rodriguez, LLP; William G. Guerin

(57) ABSTRACT

An electromagnetic coupling connector for three-dimensional electronic circuits is described. The coupling connector includes two coupling layers each having multiple electromagnetic coupling elements. Each coupling element can communicate through an electromagnetic path to a mating coupling element in a separate coupling connector. A routing layer is disposed between the two coupling layers and conducts an electrical signal between a coupling in one layer and at least one coupling element in the other layer. The coupling connector can also include a device layer having devices such as analog processors, memory modules and switching processor modules.

21 Claims, 6 Drawing Sheets

ELECTROMAGNETIC COUPLING CONNECTOR FOR THREE-DIMENSIONAL ELECTRONIC CIRCUITS

CROSS-REFERENCE TO RELATED APPLICATIONS

This application claims the benefit of provisional U.S. patent application Ser. No. 60/395,456, filed Jul. 12, 2002, titled "Electro-Magnetic Coupling Connectors," the entirety of which provisional application is incorporated by reference herein.

GOVERNMENT RIGHTS IN THE INVENTION

This invention was made with United States government support under Contract No. F19628-00-C-0002 awarded by the United States Air Force. The government may have certain rights in the invention.

FIELD OF THE INVENTION

The invention relates generally to an electromagnetic coupling connector for three-dimensional electronic circuits. More particularly, the invention relates to a coupling connector having layers of coupling elements for communication to mating coupling elements in an adjacent coupling connector through electromagnetic paths.

BACKGROUND

Various types of electrical connectors are used in analog and digital electronic systems to enable communication between sensors, processors, memory and input/output (I/O) circuitry. Conventional connectors are often inadequate for high-density electronic systems. In particular, conventional connectors cannot readily be integrated into stacked, or three-dimensional, electronic systems to provide communication between the various layers. Particularly challenging are three-dimensional circuits in which boards, or layers, of the electronics structure require replacement or repair.

Pin grid array (PGA) connectors and land grid array (LGA) connectors are commonly used for high-density connections for electronic components. PGA connectors include multiple pins on one side of the connector and sockets on the other side. The pins are often bent during assembly and do no make proper electrical connections. Furthermore, the thickness (or diameter) of the pins cannot be decreased without adversely affecting durability. Consequently, the connection density is limited. LGA connectors include a set of plated connection pads for each side of the connector. Electrical coupling is achieved using interposers or fuzz buttons to contact mating pads. PGA and LGA connectors generally exhibit wear with repeated insertion and removal, and are susceptible to dust and corrosion.

Ball grid array (BGA) connectors are commonly used to electrically couple a chip (e.g., an integrated circuit (IC)) to a circuit board. A BGA connector includes an array of solder balls and an array of pad on each side of the connector. The solder balls are melted to make connections between the pads on both sides of the connector. The connected items cannot be reliably separated once the solder process is completed. Moreover, the solder balls are subject to stress due to thermal expansion and shrinking, and the connections can fail over time.

Optical connectors are suitable for high-speed data communication. Electrical signals to be communicated to the electronic modules are converted to a modulated optical signal. The optical signals are transmitted across the optical connection and converted back to electrical signals in the receiving device. Optical connectors generally are not acceptable for high-density connections due to their inherent cost and power consumption.

Accordingly, there exists a need for a connector that can be used with high-density electronic circuits, including three-dimensional electronic circuits. The present invention satisfies this need and provides additional advantages.

SUMMARY OF THE INVENTION

The invention relates to coupling connectors for three-dimensional circuits. The coupling connectors provide high-density two-dimensional configurations of coupling elements. Coupling connectors are stacked vertically with circuit boards and devices to create three-dimensional circuits. The coupling connectors are resistant to corrosion, dust and contamination, and do not exhibit the wear of conventional connectors that results from repeated connection and disconnection.

In one aspect, the invention features a three-dimensional coupling connector having parallel first and second coupling layers and a routing layer disposed between the two coupling layers. Each coupling layer has electromagnetic coupling elements adapted for communication through electromagnetic paths between the electromagnetic coupling element and a mating electromagnetic coupling element. The routing layer conducts an electrical signal from one of the electromagnetic coupling elements in the first coupling layer to one of the coupling elements in the second coupling layer. In one embodiment, the coupling connector includes a dielectric layer disposed substantially adjacent to the first coupling layer opposite the second coupling layer. In a further embodiment, the coupling connector also includes a dielectric layer disposed substantially adjacent to the second coupling layer opposite the first coupling layer. In another embodiment, the coupling connector includes a device layer disposed between the first coupling layer and the second coupling layer. In a further embodiment, the coupling connector also includes a thermally conductive layer disposed between the first coupling layer and the second coupling layer to remove thermal energy from the device layer.

In another aspect, the invention features a three-dimensional coupling connector having a stack of circuit layers. Each of the circuit layers includes parallel first and second coupling layers and a routing layer. Each of the coupling layers includes electromagnetic coupling elements. Each of the electromagnetic coupling elements is adapted for communication through an electromagnetic path between the electromagnetic coupling element and a mating electromagnetic coupling element. The routing layer is disposed between the coupling layers and is adapted to conduct an electrical signal from one of the electromagnetic coupling elements in the first coupling layer to one of the electromagnetic coupling elements in the second coupling layer. In one embodiment, the coupling connector includes a dielectric layer disposed substantially adjacent to the first coupling layer opposite the second coupling layer. In a further embodiment, the coupling connector also includes a dielectric layer disposed substantially adjacent to the second coupling layer opposite the first coupling layer. In another embodiment, the coupling connector includes a device layer disposed between the coupling layers. In a further embodiment, the coupling connector also includes a thermally conductive layer disposed between the coupling layers to remove thermal energy from the device layer.

In another aspect, the invention features a method of transmitting a data signal between a first coupling layer and a second coupling layer using electromagnetic coupling of signal paths. Each of the first and second coupling layers includes electromagnetic coupling elements. The method includes receiving a time-dependent electromagnetic data signal at one of the electromagnetic coupling elements of the first coupling layer in response to a coupling of the electromagnetic coupling element and a first mating electromagnetic coupling element. The method also includes conducting an electrical data signal responsive to the first time-dependent electromagnetic data signal to one of the electromagnetic coupling elements of the second coupling layer and transmitting a second time-dependent electromagnetic data signal from the electromagnetic coupling element in the second layer to a second mating electromagnetic coupling element. The second time-dependent electromagnetic data signal is responsive to the electrical data signal.

BRIEF DESCRIPTION OF THE DRAWINGS

The above and further advantages of this invention may be better understood by referring to the following description in conjunction with the accompanying drawings, in which like numerals indicate like structural elements and features in various figures. The drawings are not necessarily to scale, emphasis instead being placed upon illustrating the principles of the invention.

DETAILED DESCRIPTION

In brief overview, the present invention relates to a reliable high-density, low-cost electromagnetic coupling connector that can be connected and disconnected many times. The coupling connector is resistant to wear, corrosion, dust and repeated thermal stress. The coupling connector can operate with a mating coupling connector across a small gap. Alternatively, the coupling connector can operate while in contact with the mated coupling connector. Multiple coupling connectors can be used to couple vertically stacked circuit layers, including layers having analog and digital processing modules.

Figure 1:
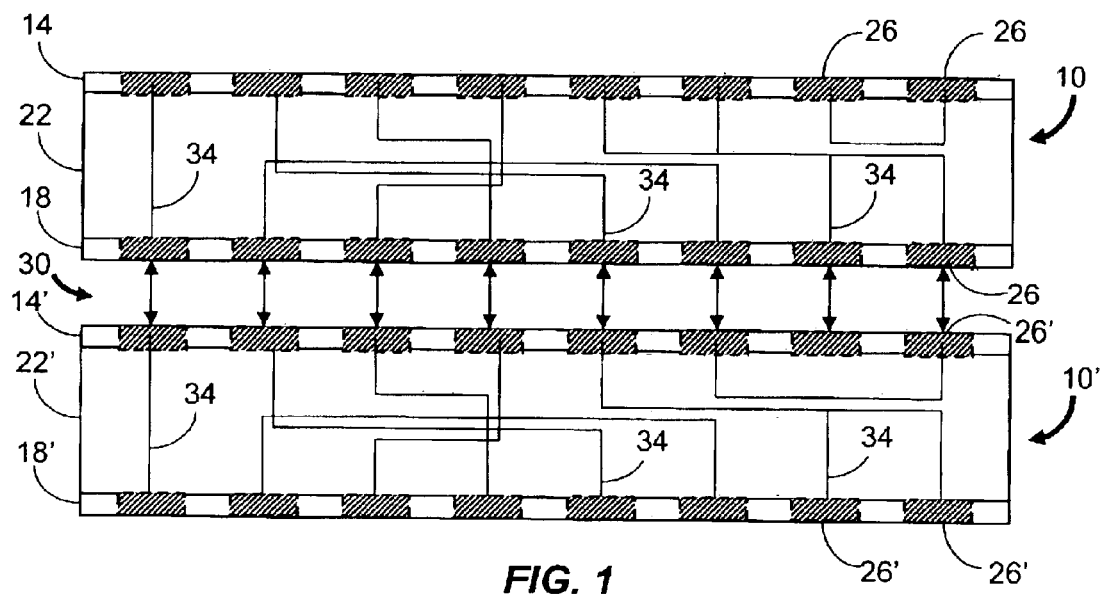
FIG. 1 is an illustration of an embodiment of mated three-dimensional coupling connectors in accordance with the invention.

FIG. 1 depicts a pair of three-dimensional coupling connectors 10 and 10' according to the present invention. The connectors 10, 10' are shown coupled to one another for transmitting and receiving data signals by electromagnetic communication. Primed references are used to identify components of coupling connector 10' that are similar to their unprimed counterparts in coupling connector 10.

The following description of FIG. 1 is limited to coupling connector 10 for simplicity. The coupling connector 10 is fabricated as a single planar structure and includes an upper coupling layer 14, a lower coupling layer 18 and a routing layer 22. Each coupling layer 14, 18 includes a set of electromagnetic coupling elements 26 which can be separated in the plane of the layer 14, 18 by air or by a non-conducting material. The location of at least one of the coupling elements 26 is selected to permit alignment with one or more respective coupling elements 26' in the adjacent coupling connector 10'. For example, the coupling elements 26 in the lower coupling layer 18 of coupling connector 10 are arranged to mate with at least some of the coupling elements 26' in the upper coupling layer 14' of coupling connector 10'. A mated coupling element is defined as a coupling element 26 that is positioned in close proximity to another coupling element 26' in a different coupling connector 10 to establish a path (depicted as bi-directional arrows) between the elements 26, 26' for the transmission of electromagnetic signals. Although it is contemplated according to the present invention that a coupling element 26 in one connector 10 can be mated with more than one coupling element 26' in a second connector 26', for example by using coupling elements 26, 26' that differ in size, the description below is limited to one-to-one mated coupling elements 26, 26'. Coupling elements 26 can be distributed in the coupling layers 14, 18 in any two-dimensional arrangement, including various arrays and linear configurations. Aligned coupling connectors 10, 10' enable communication of time-dependent electrical signals through electromagnetic paths established between the mated coupling element pairs 26, 26' across an air gap 30.

The routing layer 22 provides conductive paths 34 between the coupling elements 26 in the top coupling layer 14 and the coupling elements 26 in the bottom coupling layer 18. The conductive paths 34 can take any direction and length within the routing layer 22. The conductive paths 34 are shown to pass horizontally and vertically (i.e., within the thickness of the routing layer 22) to indicate connected coupling elements 26. It should be recognized, however, that the conductive paths 34 can be fabricated on the top and/or bottom surfaces of the routing layer 22. Alternatively, the conductive paths can be embedded in one or more planes within the thickness of the routing layer 22, for example, by fabricating multiple conducting layers each etched to form electrical traces. In this example, each conducting layer is separated from an adjacent conducting layer by an insulating layer. In alternative embodiments, two or more routing layers 22 are included in the coupling connector 10. Although the conductive paths 34 are primarily two-dimensional because the routing is achieved within a plane of the routing layer 22, the conductive paths 34 generally include pathways (e.g., via holes) that pass vertically through the routing layer 22 to permit complete paths between the coupling elements 26 in opposite coupling layers 14, 18. The routing layer 22 can include any number of conductive planes. Some conductive paths 34 provide an electrical connection between a coupling element 26 in the upper coupling layer 14 and at least one coupling element 26 in the lower coupling layer 18. Other conductive paths 34 provide an electrical connection between coupling elements 26 within the same coupling layer 14, 18. Still other conductive paths 34 provide an electrical connection between a coupling element 26 in the top coupling layer 14 with at least one other coupling element 26 in the top coupling layer 14 and at least one coupling element 26 in the lower coupling layer 18.

Figure 2:
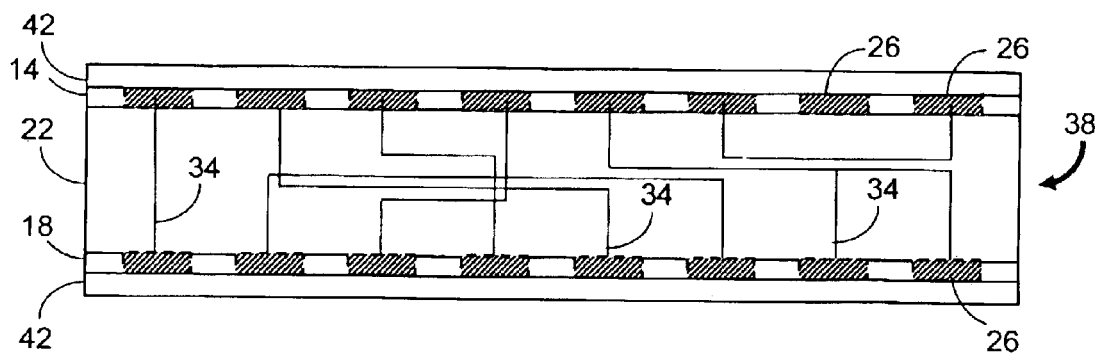
FIG. 2 is an illustration of an embodiment of a three-dimensional coupling connector in accordance with the invention.

FIG. 2 illustrates an embodiment of a three-dimensional coupling connector 38 having improved durability. The coupling connector 38 is similar to the coupling connector 10 of FIG. 1 but also includes a dielectric layer 42 fabricated over each of the coupling layers 14 and 18, respectively. The dielectric layers 42 enable the coupling connector 38 to be connected to another coupling connector through direct physical contact of the connectors 38 without subjecting the coupling elements 26 to potentially damaging contact. Moreover, because there is no air gap 30 (see FIG. 1) between the connectors 38, there is no means for dust to intrude between the coupling elements 26. In addition, the dielectric layers 42 seal, or encapsulate, the coupling elements 26 thereby preventing corrosion that can otherwise result from exposure to air and moisture. Optionally, one of the dielectric layers 42 can be omitted if the coupling connector 38 is intended to be coupled to another coupling connector at only one side (i.e., coupling layer 14 or coupling layer 18).

Figure 3:
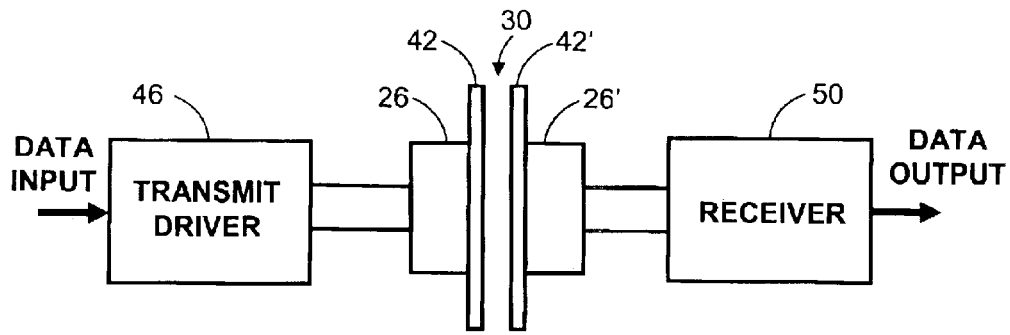
FIG. 3 is an illustration of a mated pair of electromagnetic coupling elements configured for unidirectional communication in accordance with an embodiment of the invention.

FIG. 3 shows a pair of mated coupling elements 26 and 26' from the coupling connectors 10 and 10', respectively, of FIG. 1 configured for unidirectional communication. Each coupling element 26, 26' is protected by a portion of the adjacent dielectric layers 42, 42', respectively. Coupling element 26 is in electrical communication with a transmit driver circuit 46 and coupling element 26' is in electrical communication with a receiver circuit 50. The transmit driver circuit 46 and receiver circuit 50 can be fabricated near their respective coupling elements 26, 26' or can be fabricated farther away and coupled to the coupling elements 26, 26' by wires or transmission lines. Preferably, the transmit driver circuit 46 and the receiver circuit 50 are fabricated in a device layer (described below). The connections to the coupling elements 26, 26' can be single ended or double ended (i.e., two electrical paths) according to the type of coupling elements, signal integrity requirements, and whether a common reference voltage (i.e., ground) is available for both coupling elements 26, 26'.

In operation, a data signal provided by the transmit driver circuit 46 and transmit coupling element 26 is electromagnetically communicated across an air gap 30 between the coupling elements 26, 26' and converted to an electrical data output signal by the receiving coupling element 26' and receiver circuit 50. Although the illustration shows the coupling elements 26, 26' as separated by the dielectric layers 42, 42' and the air gap 30, the dielectric layers 42, 42' can be in contact (i.e., no air gap) and electromagnetic communication between the coupling elements 26, 26' is possible.

Figure 4:
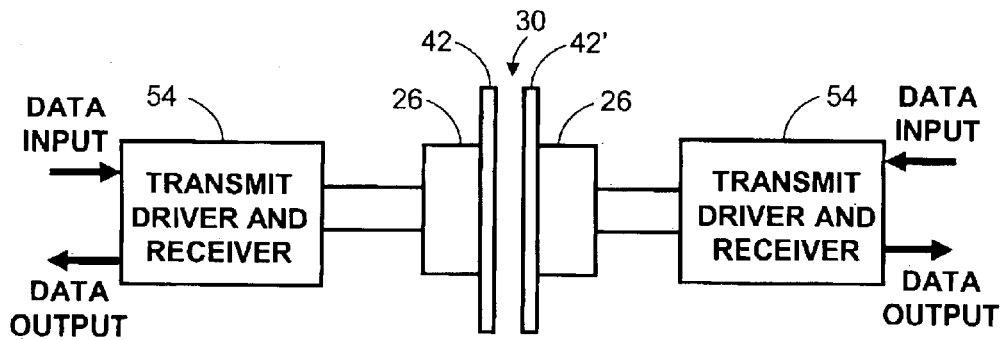
FIG. 4 is an illustration of a mated pair of electromagnetic coupling elements configured for bi-directional communication in accordance with an embodiment of the invention.
Figure 5:
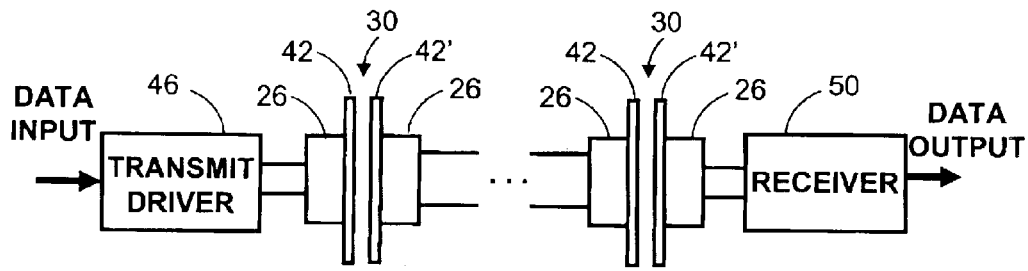
FIG. 5 is an illustration of serial pairs of mated coupling elements in accordance with an embodiment of the invention.

Many variations can be made to the configuration of components illustrated in FIG. 3. For example, one or more of the coupling elements 26, 26', transmit drive circuit 46 and receiver circuit 50 can include impedance matching networks for improving signal transfer or to prevent signal reflections. In another example, bi-directional communication between mated coupling elements 26, 26' is possible by replacing the transmit driver circuit 46 and receiver circuit 50 with transceiver circuits 54 as shown in FIG. 4. FIG. 5 illustrates serial pairs of mated coupling elements 26, 26' (only two pairs shown for clarity). In this configuration, a data signal can be transmitted through multiple coupling connectors. Because intermediate routing layers are constructed to conduct electrical signals laterally (i.e., through paths within the plane of each routing layer), it is possible to communicate a data signal from one coupling element 26 to any other coupling element 26 in any coupling connector in the same three-dimensional structure.

Figure 6:
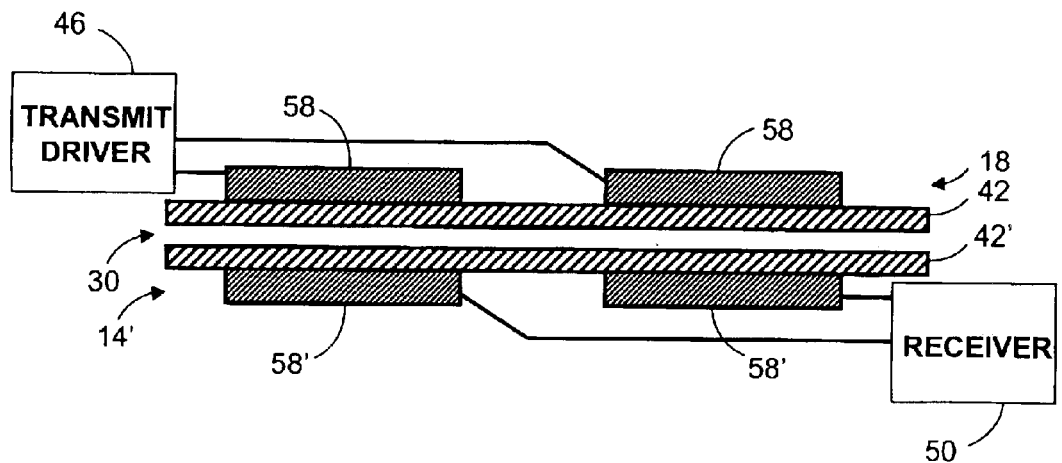
FIG. 6 is an illustration of mated capacitive coupling elements in accordance with an embodiment of the invention.

FIG. 6 illustrates a portion of two communicating coupling connectors 38, 38' (see FIG. 2). Each coupling connector 38, 38' includes a coupling layer 18 and 14', respectively, having double-ended capacitive coupling elements 58 and 58', respectively, for differential signal transfer. One capacitive coupling element 58 is coupled to a transmit driver circuit 46 the other capacitive coupling element 58' is coupled to a receiver circuit 50. The capacitive coupling elements 58, 58' are fabricated as flat conductive pads. The pads can be circular, rectangular, hexagonal, or other shape. In other embodiments, the pads are non-planar structures such as portions of cylinders or spheres. Optionally, any number of pads can be configured to operate as a single coupling element 58, 58'.

The capacitive coupling connectors 38, 38' are aligned to reduce or eliminate any offset between the mated pads as measured in the planes of the pads to achieve increased capacitance. The gap 30 between the pads is minimized to further increase capacitance. Moreover, the dielectric layers 42, 42' are fabricated using materials having large dielectric constants. Electrolytic materials can be used for even greater capacitance.

Figure 7:
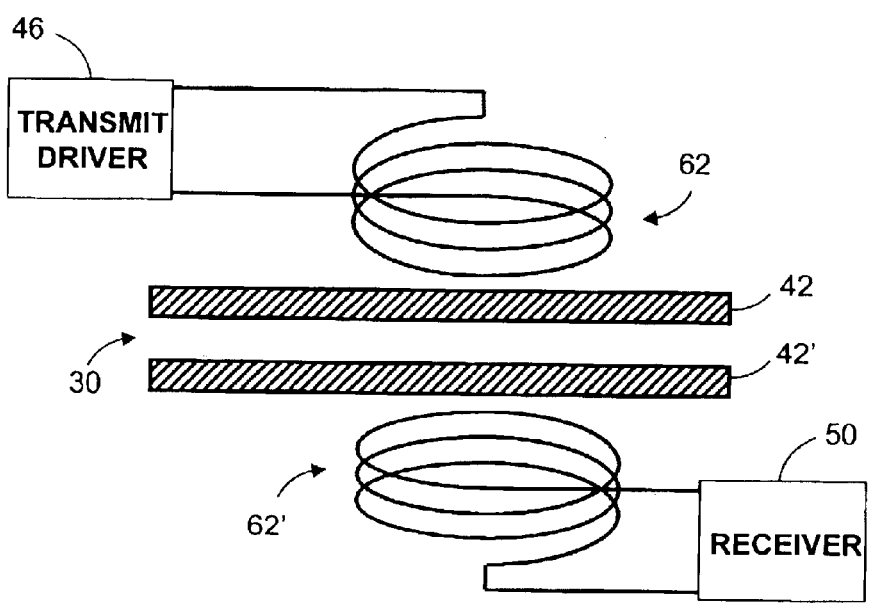
FIG. 7 is an illustration of mated inductive coupling elements in accordance with an embodiment of the invention.

FIG. 7 illustrates two mated inductive coupling elements 62, 62' configured for unidirectional communication. The inductive coupling elements 62, 62' are coupled to a transmit driver circuit 46 and a receiver circuit 50, respectively. Each inductive coupling element 62, 62' is fabricated as an electrical coil or spiral. The coil cross-sectional shape can be, for example, circular, rectangular or hexagonal. A single inductive coupling element 62, 62' can be fabricated as multiple coils. Minimal lateral offset and minimum separation between the mated coupling elements 62, 62' is desired. In one embodiment (not shown), ferrite material is used to reduce the lateral extent of the electromagnetic field generated between the mated inductive coupling elements 62, 62'. Consequently, the minimum distance between adjacent inductive coupling elements 62, 62' in the same coupling layer 14, 18 (see FIG. 2) for non-interfering operation is reduced and a higher density of inductive coupling elements 62, 62' is possible.

Both capacitive and inductive coupling elements can be used in the same coupling connector if there is no substantial electromagnetic interference at one of the coupling elements resulting from the overlap of the generated electromagnetic field from the other coupling element. In one instance, each type of coupling element is used to transmit or receive a specific signal type. For example, capacitive coupling can be used for high-speed data signals and inductive coupling can be used to supply power in a non-interfering manner. Alternatively, both types of coupling elements are combined as a single coupling element to increase the signal quality (e.g., signal-to-noise ratio).

Figure 8:
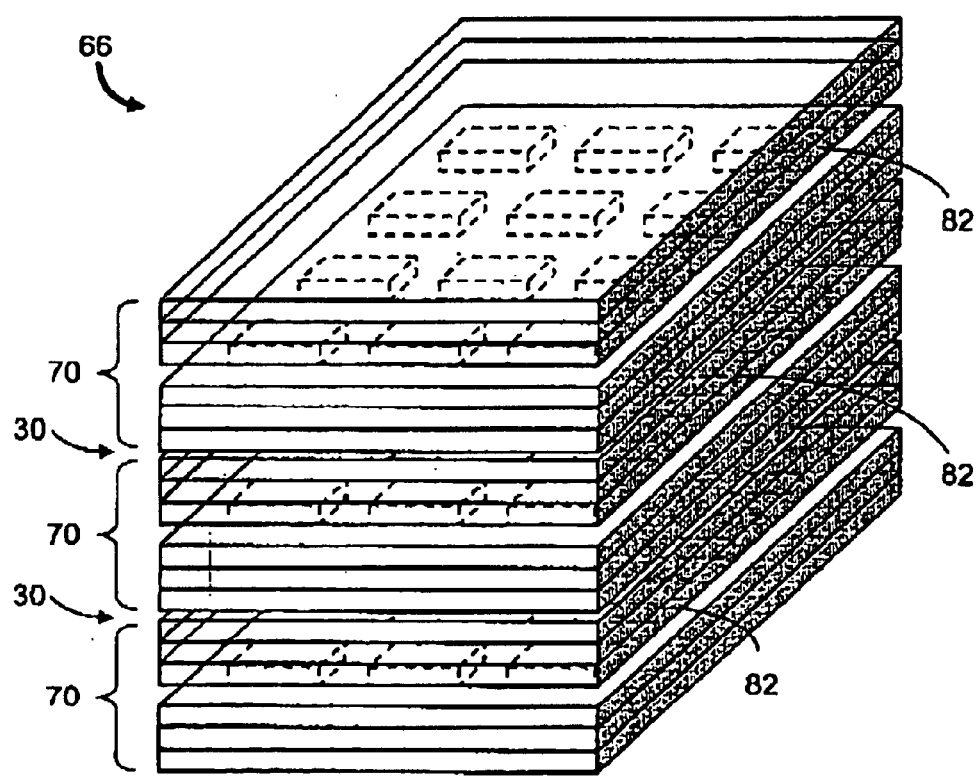
FIG. 8 is an illustration of an embodiment of a three-dimensional circuit in accordance with the invention.
Figure 9:
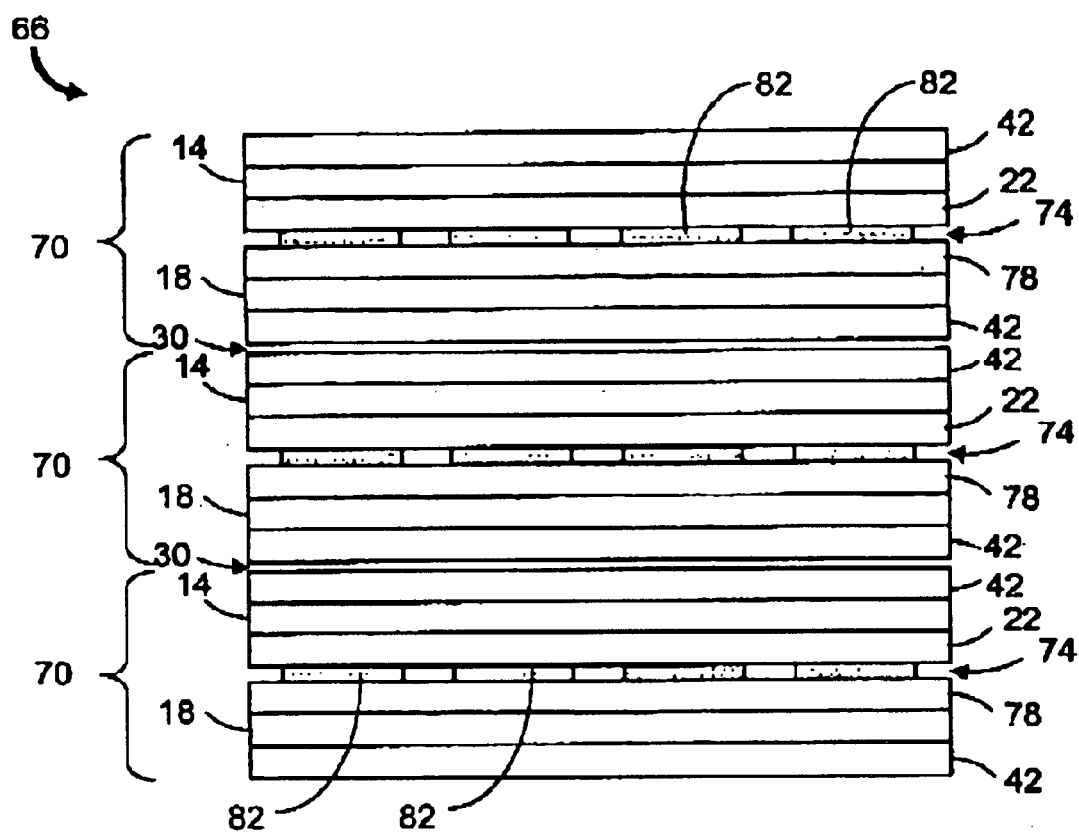
FIG. 9 is a side view illustration of the three-dimensional circuit of FIG. 8.

FIG. 8 depicts a three-dimensional circuit 66 in accordance with the present invention and FIG. 9 depicts a side view of the circuit 66 of FIG. 8. The illustrated embodiment shows three circuit layers 70 in the three-dimensional circuit 66, although any number of circuit layers 70 is contemplated by the present invention. A circuit layer 70 can be any circuit that is implemented in a substantially planar structure. For example, a circuit layer 70 can include a circuit board having very large-scale integration (VLSI) processors and/or multi-chip modules (MCMs). The circuit layers 70 are arranged, or stacked, vertically with high-density, high-speed interconnections.

Each circuit layer 70 includes an upper coupling layer 14, a two-dimensional routing layer 22, a device layer 74, a thermally-conductive layer 78 and a lower coupling layer 18. The upper and lower coupling layers 14, 18 are covered by dielectric layers 42. Preferably, the thermal expansion coefficients of the various layers are similar to reduce thermal stress. In one embodiment, the thermal expansion coefficients of the layers are approximately equal to the thermal expansion coefficient of silicon.

Each device layer 74 includes one or more electronic modules or devices 82. The devices 82 are used for processing data, providing active switching functionality or performing specialized functions. By way of example, the devices 74 can be analog processors, digital processors, switching modules and memory modules. In one embodiment, multiple device layers 74 are fabricated in a single circuit layer 70.

Figure 10:
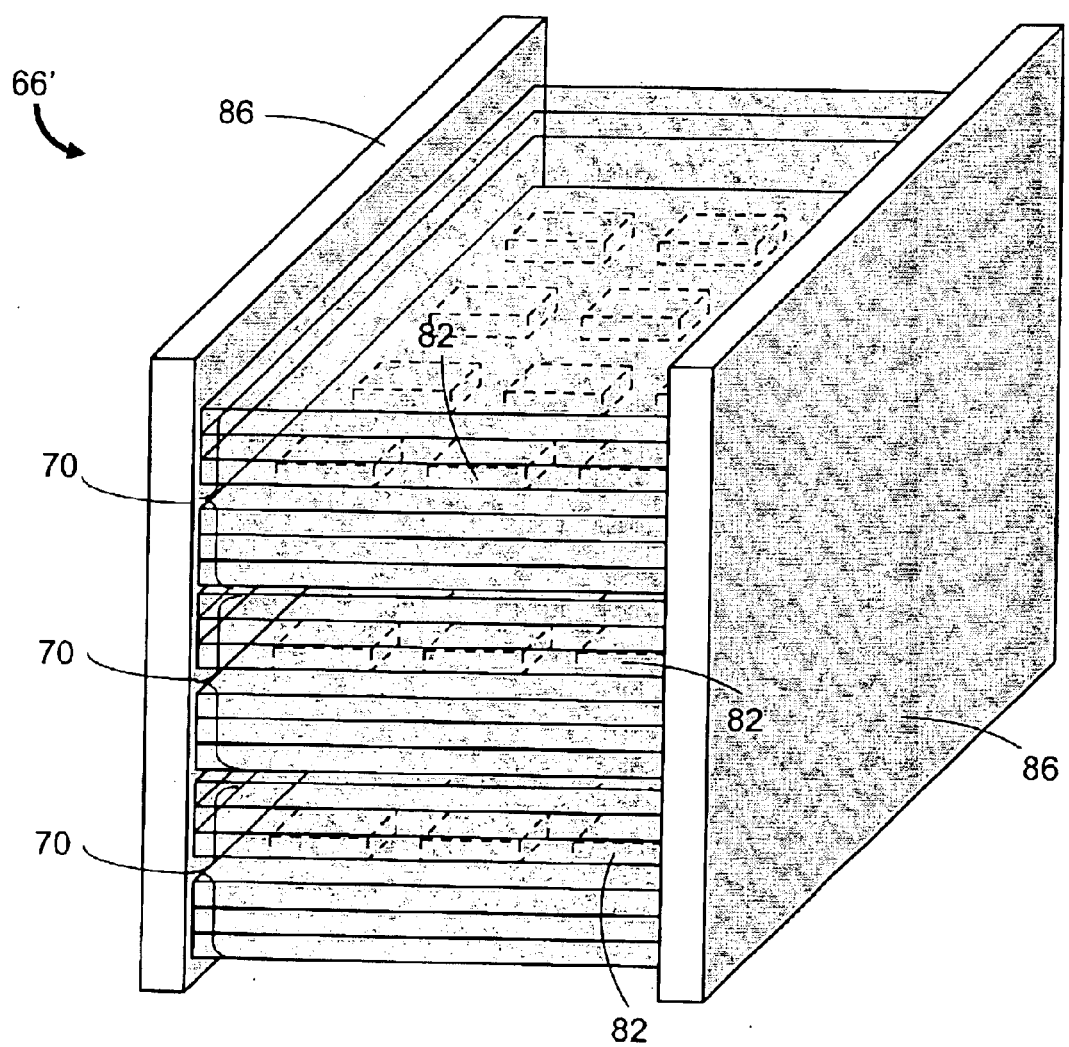
FIG. 10 is an illustration of an embodiment of a three-dimensional circuit in accordance with the invention.

Devices 82 can generate excess heat which, if not removed from the device layer 74, results in degraded performance or inoperability of the three-dimensional circuit 66. The thermally-conductive layer 78 provides a thermal path to conduct heat from the devices 82 to a heat sink structure such as the cold plates 86 shown in the three-dimensional circuit 66' of FIG. 10. Multiple thermally-conductive layers 78 can be included in a single circuit layer 70 to improve thermal management. Heat can be removed from the cold plates in many ways, for example, by air convection or liquid cooling. Thermally-conductive layers 78 include via holes for conductive paths by which electrical signals can pass. The thermally-conductive layers 78 are fabricated from a material having high thermal conductivity, such as a silicon or graphite substrate. Alternatively, passive micro heat pipes are embedded in the thermally-conductive layer 78. In another embodiment, an active liquid cooling system is embedded in the thermally-conductive layer 78.

While the invention has been shown and described with reference to specific preferred embodiments, it should be understood by those skilled in the art that various changes in form and detail may be made therein without departing from the spirit and scope of the invention as defined by the following claims. For example, the invention is not limited to a coupling connector having a single routing layer, a single device layer and a single thermally-conductive layer. Instead, the coupling connector of the invention can include multiple layers of various types according to the requirements of the specific connector application.

What is claimed is:

1. A three-dimensional coupling connector comprising:
   a first coupling layer having a first plurality of electromagnetic coupling elements;
   a second coupling layer disposed substantially parallel to the first coupling layer and having a second plurality of electromagnetic coupling elements, each of the electromagnetic coupling elements of the first and second pluralities of electromagnetic coupling elements being adapted for electromagnetic communication through an electrically non-conductive gap between the electromagnetic coupling element end a mating electromagnetic coupling element; and
   a routing layer disposed between the first coupling layer and the second coupling layer, the routing layer conducting an electrical signal from one of the electromagnetic coupling elements in the first plurality of electromagnetic coupling element to one of the electromagnetic coupling elements in the second plurality of electromagnetic coupling elements.

2. The coupling connector of claim 1 further comprising a dielectric layer disposed substantially adjacent to the first coupling layer opposite the second coupling layer.

3. The coupling connector of claim 2 further comprising a dielectric layer disposed substantially adjacent to the second coupling layer opposite the first coupling layer.

4. The coupling connector of claim 1 wherein the first coupling layer, the routing layer and the second coupling layer comprise an integrated planar structure.

5. The coupling connector of claim 4 further comprising a third coupling layer having a third plurality of electromagnetic coupling elements, the third coupling layer being adapted for placement substantially adjacent to the integrated planar structure and removal therefrom, each of the third plurality of electromagnetic coupling elements being in substantial alignment with a respective one of the second plurality of electromagnetic coupling elements when the second and third coupling layers are in a coupled state.

6. The coupling connector of claim 1 comprising a device layer disposed between the first coupling layer and the second coupling layer.

7. The coupling connector of claim 6 wherein the device layer comprises at least one of an analog processor, a memory module, a digital processor module and a switching module.

8. The coupling connector of claim 6 further comprising a thermally conductive layer disposed between the first coupling layer and the second coupling layer, the thermally conductive layer adapted to remove thermal energy from the device layer.

9. The coupling connector of claim 1 wherein at least one of the electromagnetic coupling elements comprises a capacitive coupling element.

10. The coupling connector of claim 1 wherein at least one of the electromagnetic coupling elements comprises an inductive coupling element.

11. The coupling connector of claim 1 further comprising an integrated circuit disposed between the first coupling layer and the second coupling layer.

12. A three-dimensional circuit comprising a stack of circuit layers, each of the circuit layers comprising:
    a first coupling layer having a first plurality of electromagnetic coupling elements;
    a second coupling layer disposed substantially parallel to the first coupling layer and having a second plurality of electromagnetic coupling elements, each of the electromagnetic coupling elements of the first and second pluralities of electromagnetic coupling elements being adapted for electromagnetic communication through an electrically non-conductive gap between the electromagnetic coupling element and a mating electromagnetic coupling element; and
    a routing layer disposed between the first coupling layer and the second coupling layer, the routing layer adapted to conduct an electrical signal from one of the first plurality of electromagnetic coupling elements to one of the second plurality of electromagnetic coupling elements.

13. The circuit of claim 12 further comprising a dielectric layer disposed substantially adjacent to the first coupling layer opposite the second coupling layer.

14. The circuit of claim 13 further comprising a dielectric layer disposed substantially adjacent to the second coupling layer opposite the first coupling layer.

15. The circuit of claim 12 further comprising a device layer disposed between the first coupling layer and the second coupling layer.

16. The circuit of claim 15 further comprising a thermally conductive layer disposed between the first coupling layer and the second coupling layer, the thermally conductive layer adapted to remove thermal energy from the device layer.

17. A method of transmitting a data signal between a first coupling layer and a second coupling layer of a three-dimensional coupling connector, each of the first and second coupling layers having a plurality of electromagnetic coupling elements, the method comprising:

transmitting a first time-dependent electromagnetic data signal from a first mating electromagnetic coupling element across a first electrically non-conductive gap to one of the electromagnetic coupling elements of the first coupling layer;

conducting an electrical data signal responsive to the first time-dependent electromagnetic data signal to one of the electromagnetic coupling elements of the second coupling layer; and transmitting a second time-dependent electromagnetic data signal from the one of the electromagnetic coupling elements of the second coupling layer across a second electrically non-conductive gap to a second mating electromagnetic coupling element, the second time-dependent electromagnetic data signal being responsive to the electrical data signal.

18. A three-dimensional coupling connector comprising:

a first coupling layer having a plurality of electromagnetic coupling elements;

a second coupling layer disposed substantially parallel to the first coupling layer and having a plurality of electromagnetic coupling elements, each of the electromagnetic coupling elements of the first and second coupling layers being adapted for electromagnetic communication through an electrically non-conductive gap between the electromagnetic coupling element and a respective mating electromagnetic coupling element;

a device layer having at least one module and being disposed between the first coupling layer and the second coupling layer;

a thermally conductive layer disposed adjacent to the device layer; and a routing layer disposed between the first coupling layer and the second coupling layer.

19. The coupling connector of claim 18 wherein the routing layer conducts an electrical signal from one of the electromagnetic coupling elements of the first layer to one of the electromagnetic coupling elements of the second layer.

20. The coupling connector of claim 18 wherein the routing layer conducts an electrical signal from one of the electromagnetic coupling elements of the first coupling layer to one of the other electromagnetic coupling elements of the first layer.

21. The coupling connector of claim 18 wherein the routing layer conducts an electrical signal from one of the electromagnetic coupling elements of the first coupling layer to the module of the device layer.

* * * * *